(12) United States Patent
Ishizaki

(10) Patent No.: US 12,575,220 B2
(45) Date of Patent: Mar. 10, 2026

(54) ELECTRONIC DEVICE AND METHOD FOR PRODUCING THE SAME

(71) Applicant: SHIN-ETSU HANDOTAI CO., LTD., Tokyo (JP)

(72) Inventor: Junya Ishizaki, Takasaki (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 59 days.

(21) Appl. No.: 17/611,713

(22) PCT Filed: May 26, 2020

(86) PCT No.: PCT/JP2020/020645
§ 371 (c)(1),
(2) Date: Nov. 16, 2021

(87) PCT Pub. No.: WO2020/250662
PCT Pub. Date: Dec. 17, 2020

(65) Prior Publication Data
US 2022/0238732 A1 Jul. 28, 2022

(30) Foreign Application Priority Data
Jun. 13, 2019 (JP) ................................. 2019-110674

(51) Int. Cl.
*H10F 19/75* (2025.01)
*H10F 10/163* (2025.01)
(Continued)

(52) U.S. Cl.
CPC ......... *H10F 77/955* (2025.01); *H10F 10/163* (2025.01); *H10F 19/75* (2025.01);
(Continued)

(58) Field of Classification Search
CPC ........... H01L 31/02021; H01L 31/0443; H10F 19/75; H10F 71/00; H10F 71/1272; H10F 77/955; H10F 77/90
See application file for complete search history.

(56) References Cited

U.S. PATENT DOCUMENTS 6,229,165 B1 * 5/2001 Sakai .................. H01L 27/1443
257/E27.128
2005/0183765 A1 8/2005 Ho et al.
(Continued)

FOREIGN PATENT DOCUMENTS

CN 104124312 A 10/2014
CN 109119501 * 1/2019
(Continued)

OTHER PUBLICATIONS

Apr. 26, 2023 Extended European Search Report issued in European Patent Application No. 20822513.6.
(Continued)

*Primary Examiner* — Uyen M Tran
(74) *Attorney, Agent, or Firm* — Oliff PLC

(57) ABSTRACT

A method for producing an electronic device having a drive circuit including a solar cell structure, the method including the steps of: having a first wafer having solar cell structures on a starting substrate and a second wafer having drive circuits formed, so that either one of the first wafer or the second wafer has a plurality of independent diode circuits and capacitor-function laminated portions; obtaining a bonded wafer by bonding so that the solar cell structures, the diode circuits, the capacitor-function laminated portions, and the drive circuits are superimposed; wiring; and dicing the bonded wafer; thus creating a method for producing an electronic device including a drive circuit, a solar cell structure, and a capacitor-function portion in one chip and (Continued)

having a suppressed production cost; and such an electronic device.

1 Claim, 8 Drawing Sheets

(51) Int. Cl.
| | |
|---|---|
| *H10F 71/00* | (2025.01) |
| *H10F 77/00* | (2025.01) |
| *H10F 77/90* | (2025.01) |

(52) U.S. Cl.
CPC ......... *H10F 71/00* (2025.01); *H10F 71/1272* (2025.01); *H10F 77/90* (2025.01)

(56) References Cited

U.S. PATENT DOCUMENTS

| | | | |
|---|---|---|---|
| 2009/0120485 A1 | 5/2009 | Kikinis | |
| 2009/0168410 A1 | 7/2009 | Tanamura et al. | |
| 2014/0345681 A1 | 11/2014 | Yoshida et al. | |
| 2015/0270860 A1 | 9/2015 | McCain | |
| 2016/0011020 A1 | 1/2016 | Ehrenpfordt et al. | |
| 2016/0043256 A1* | 2/2016 | Nagano | H01L 31/18 |
| | | | 438/57 |

FOREIGN PATENT DOCUMENTS

| | | | | | |
|---|---|---|---|---|---|
| CN | 109119501 A | * | 1/2019 | | |
| EP | 20070004767 A | * | 7/1990 | | |
| GB | 2346010 | * | 7/2000 | | |
| GB | 2346010 A | * | 7/2000 | ......... | H01L 31/0443 |
| JP | S59-217991 A | | 12/1984 | | |
| JP | 2002-517098 A | | 6/2002 | | |
| JP | 2004-140122 A | | 5/2004 | | |
| JP | 2005-228944 A | | 8/2005 | | |
| JP | 2008-210886 A | | 9/2008 | | |
| JP | 2009-229975 A | | 10/2009 | | |
| JP | 2013-4632 A | | 1/2013 | | |
| JP | 2015-164155 A | | 9/2015 | | |
| JP | 2018-148074 A | | 9/2018 | | |
| KR | 0111899 B1 | * | 1/2007 | | |
| KR | 10-2011-0027274 A | | 3/2011 | | |
| WO | 2013/042525 A1 | | 3/2013 | | |

OTHER PUBLICATIONS

Aug. 11, 2020 International Search Report issued in International Patent Application No. PCT/JP2020/020645.

Feb. 19, 2025 Office Action issued in Chinese Patent Application No. 202080038718.3.

Jul. 19, 2024 Office Action issued in Korean Patent Application No. 2021-7039629.

* cited by examiner

[FIG. 1]
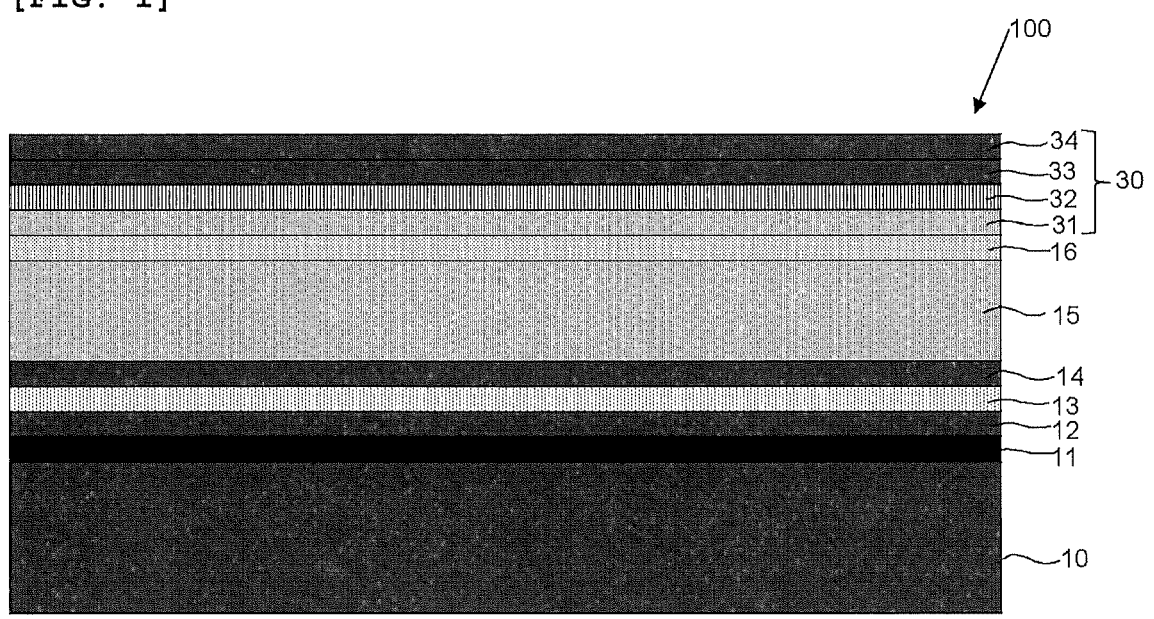
[FIG. 2]
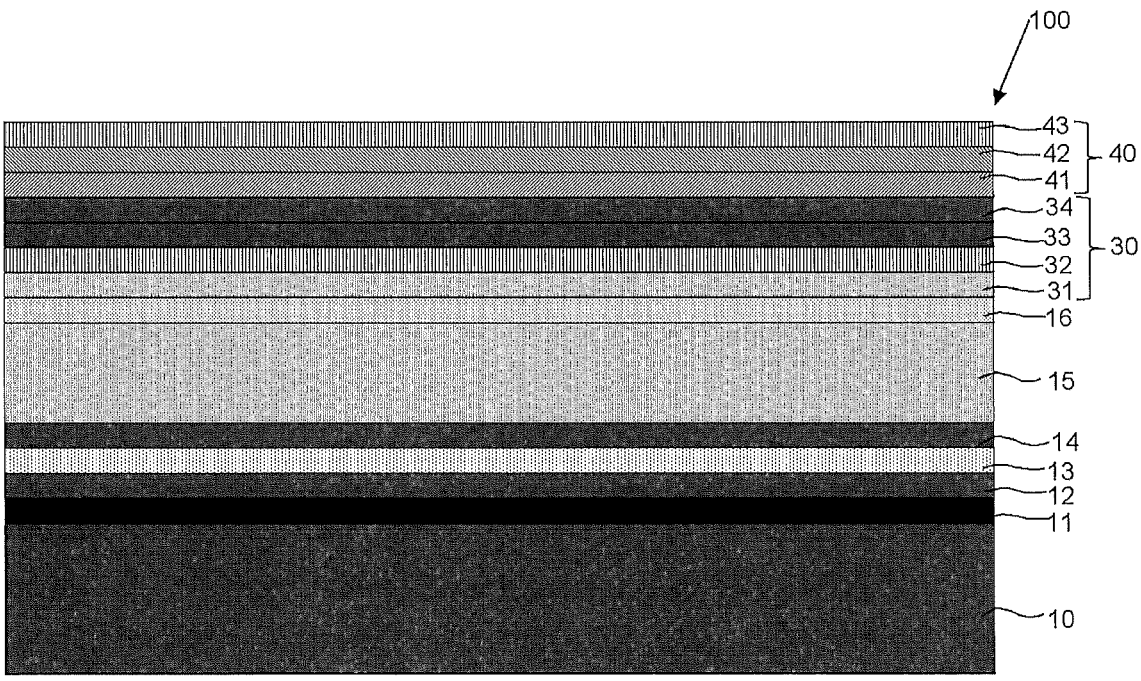

[FIG. 3]
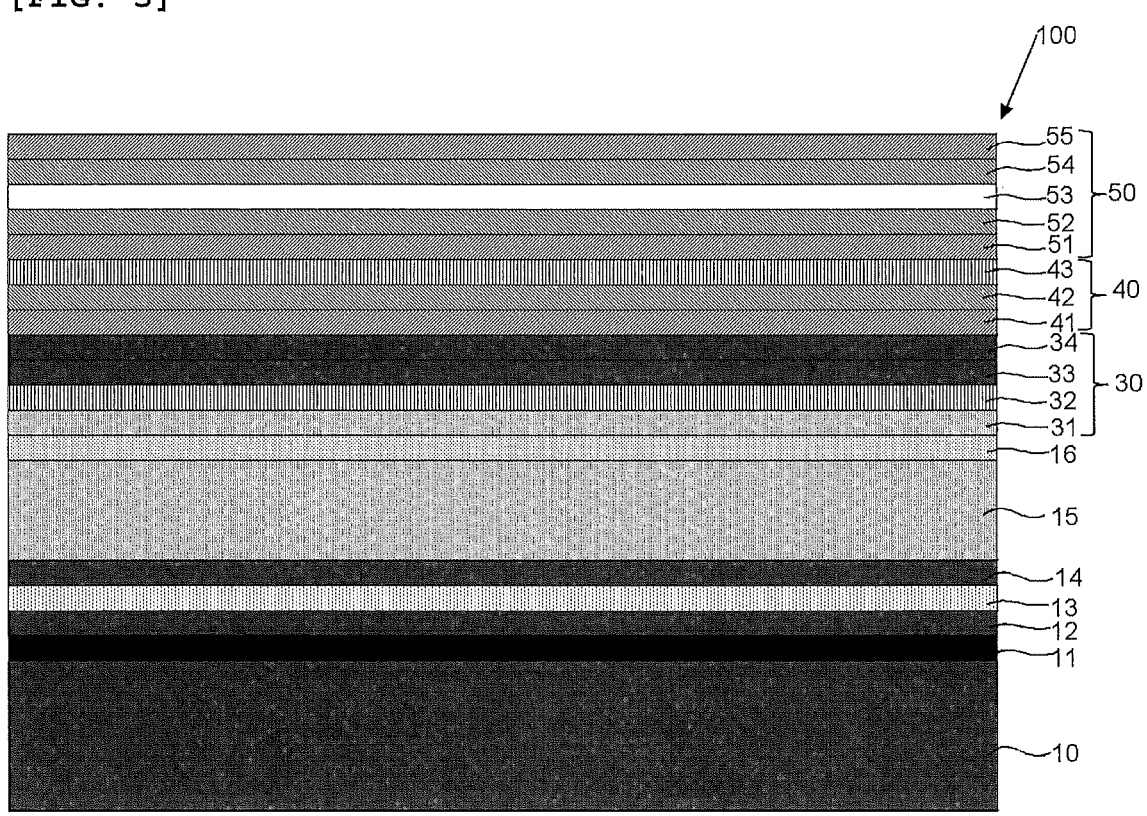
[FIG. 4]
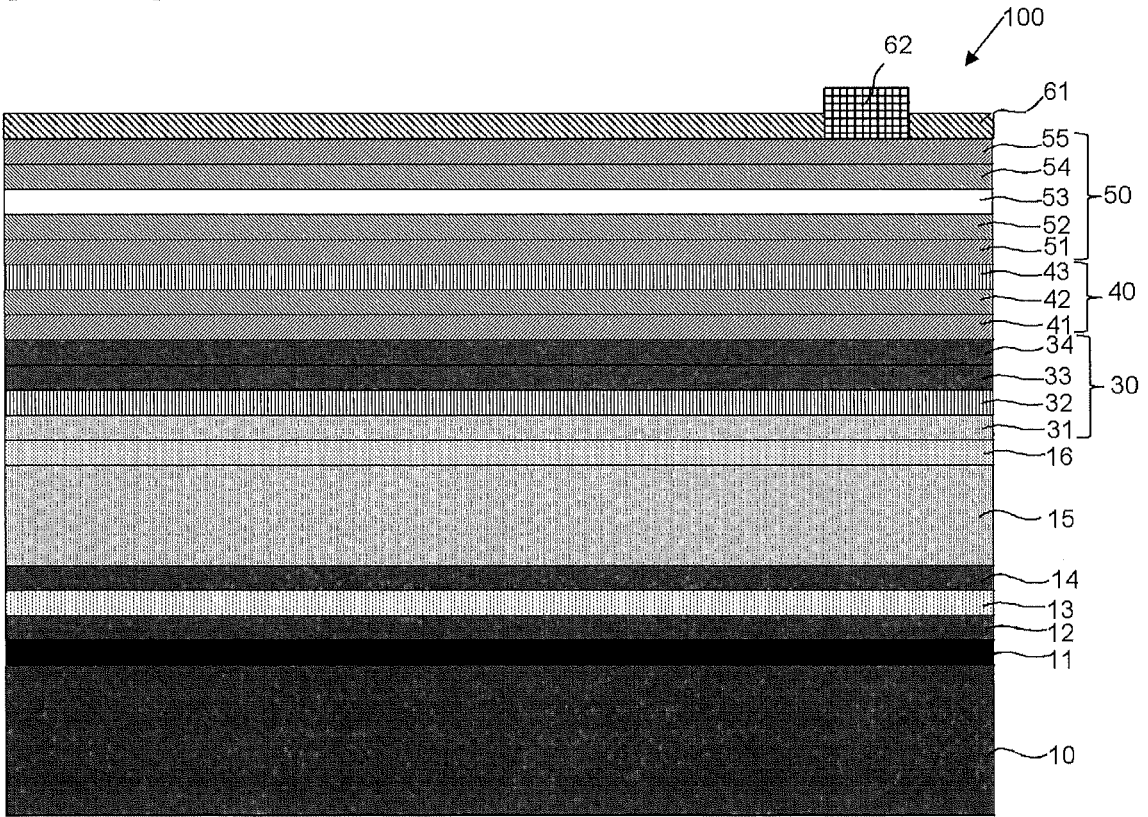

[FIG. 5]
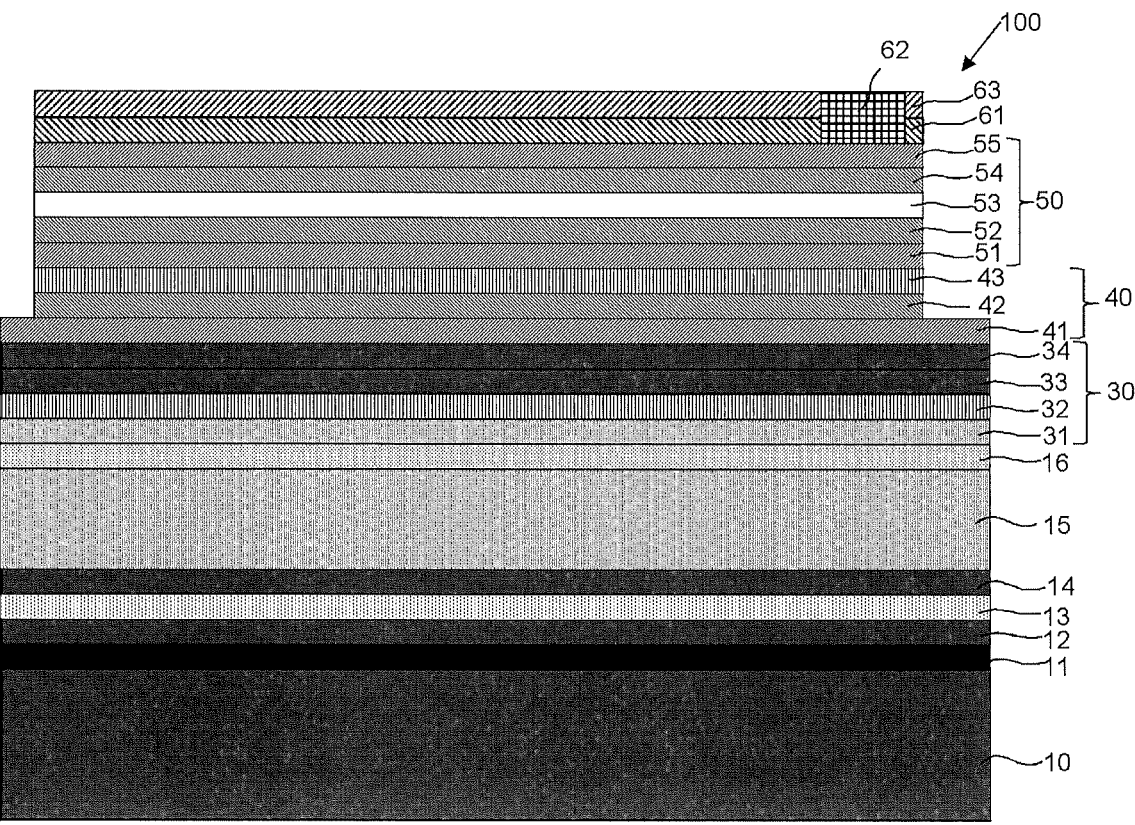
[FIG. 6]
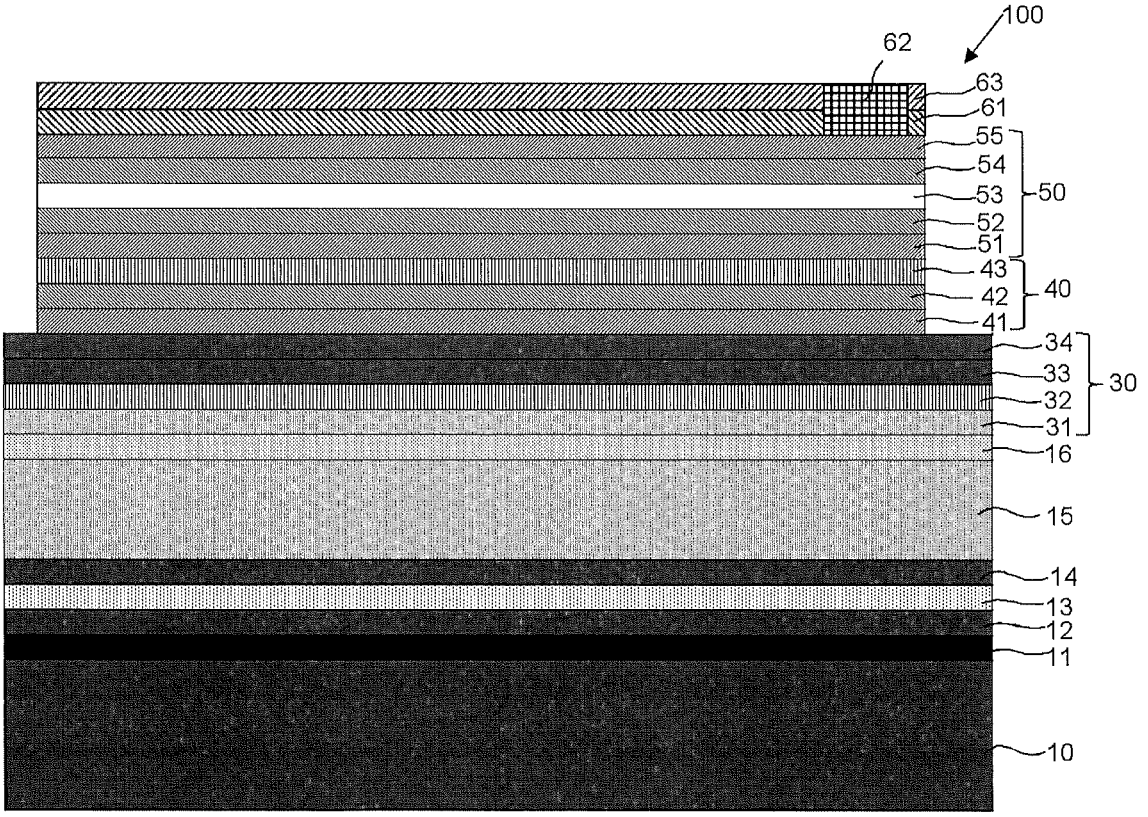

[FIG. 7]
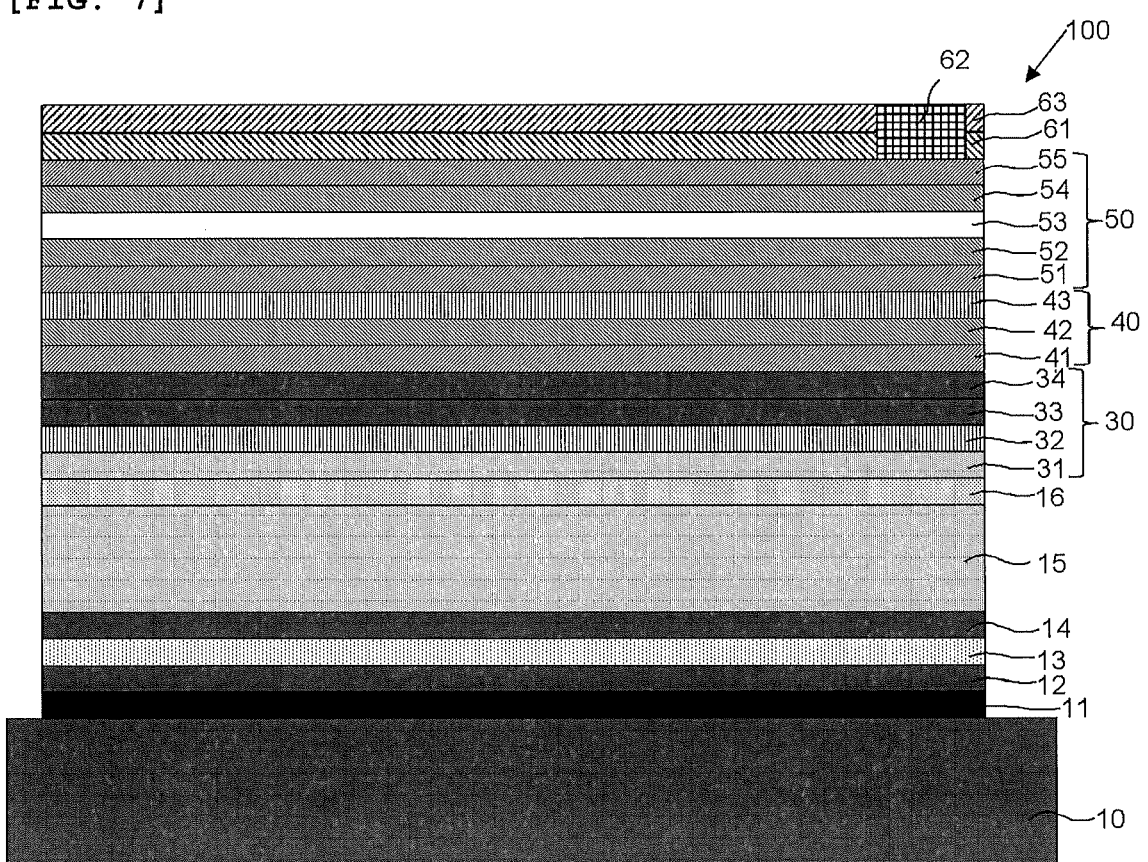

[FIG. 8]

[FIG. 9]
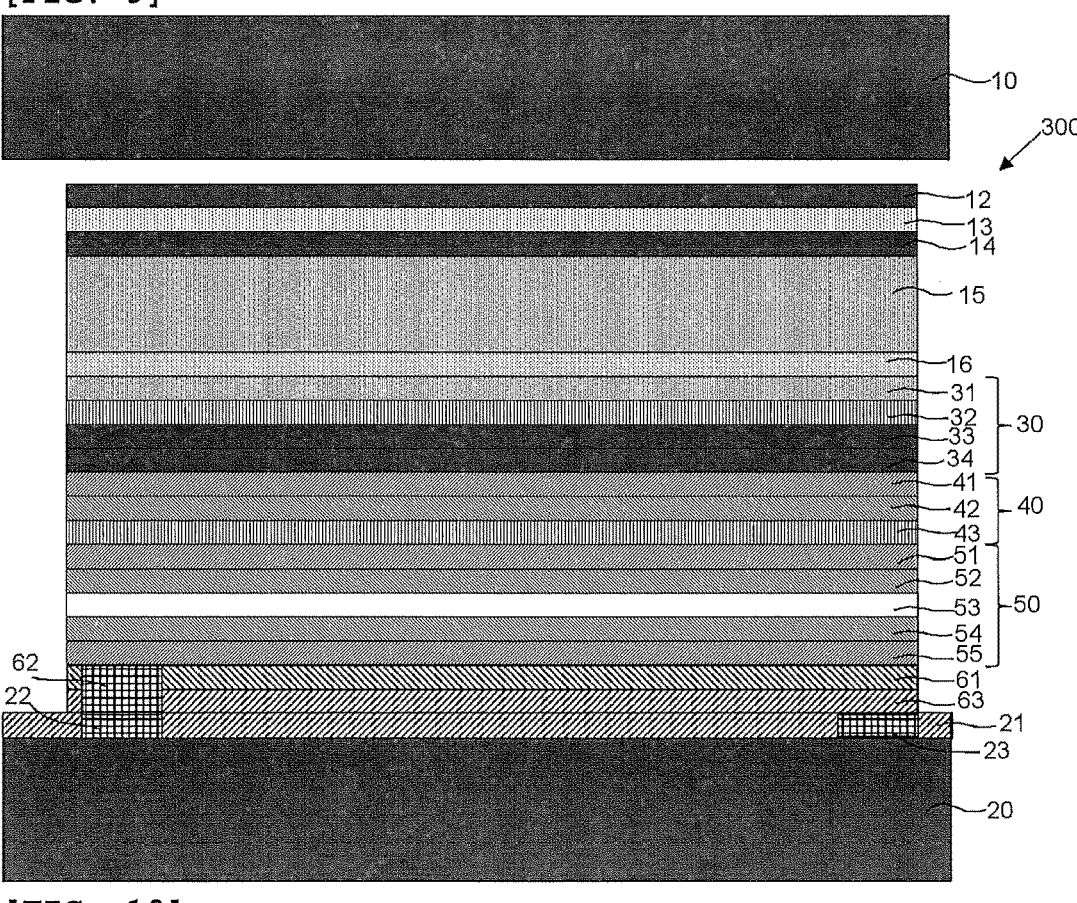
[FIG. 10]
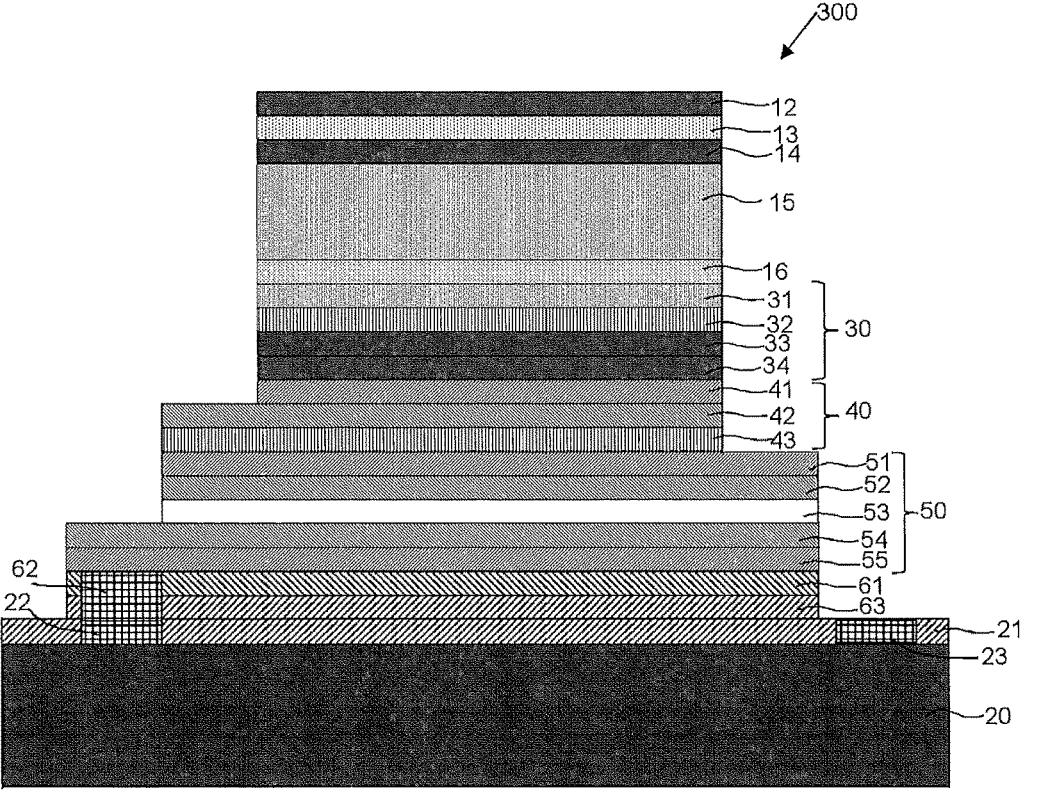

[FIG. 11]
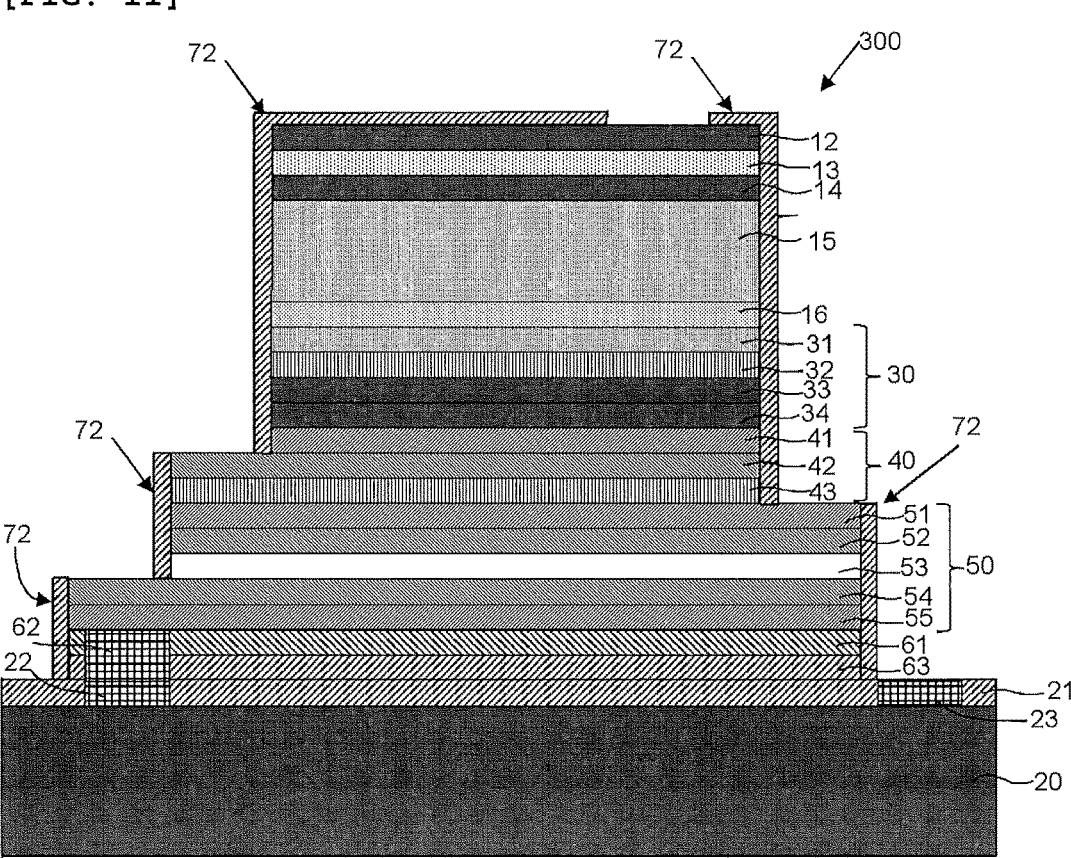
[FIG. 12]
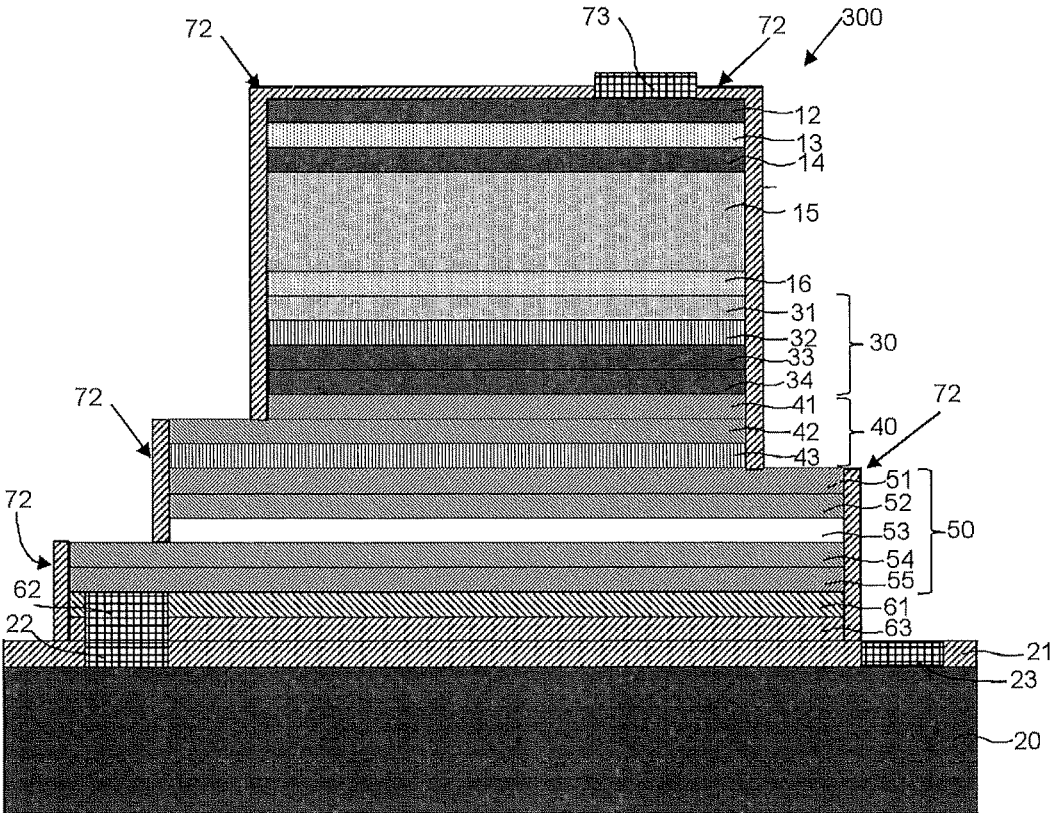

[FIG. 13]
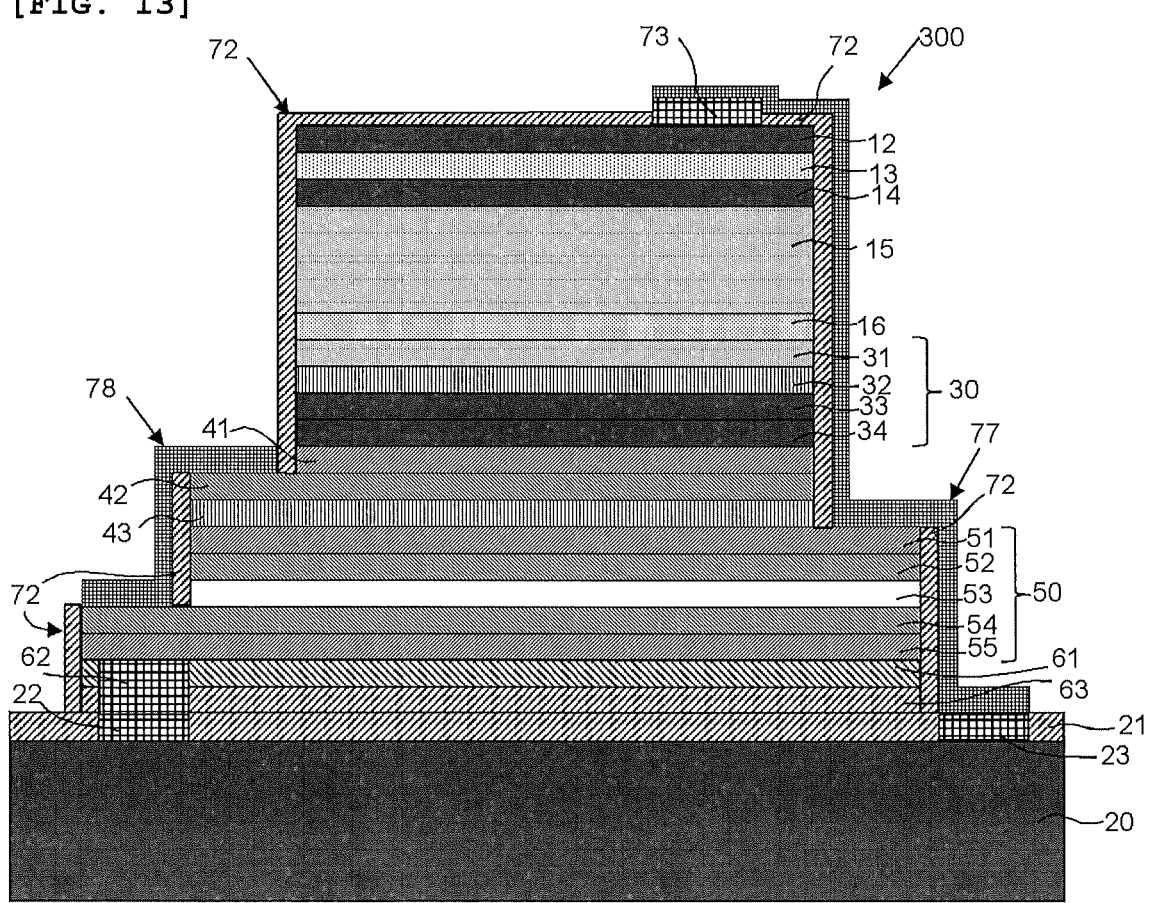

ELECTRONIC DEVICE AND METHOD FOR PRODUCING THE SAME

TECHNICAL FIELD

The present invention relates to: an electronic device; and a method for producing the same.

BACKGROUND ART

Electronic devices such as sensors for IoT (Internet of Things) require chips that are compact and that are driven with low power consumption, and are required to be inexpensive. For such electronic devices, it is ideal to provide a power source on the outside to drive various sensors by electric power supplied from outside to achieve stable operation. However, mounting cost required for wiring becomes massive, and inexpensive sensor-mounting becomes difficult. Accordingly, sensors for IoT require the realization of devices that do not need to be wired for a drive power source.

In addition, an electronic device needs to be compact in order to be inexpensive. In order to realize the above conditions, it is necessary to achieve a drive circuit and a drive-power-receiving device in one chip in an electronic device. As a system for obtaining a power supply wirelessly, it is possible to select either microwaves or light. However, microwaves have great output attenuation due to distance, and are not suitable as an electricity supply system for sensors for IoT having a dispersal arrangement.

Accordingly, an optical wireless power feeding system is suitable for use in IoT sensors.

A power receiving device for optical wireless power receiving is a solar cell, and it is difficult to provide a drive circuit and a power receiving device in one chip. It is possible to provide a drive circuit area first, and then form a solar cell device for receiving power (receiving light) in a region other than the drive circuit area.

However, the power receiving efficiency of a Si-based solar cell on which a drive circuit is mounted is not high, and a large area is required. In addition, besides the drive circuit, a capacitor function for charging an electric charge temporarily is necessary for stable operation, and the device requires an even larger area.

As a result, it is difficult to fabricate an inexpensive device. It is also possible to epitaxially grow a solar cell including a compound semiconductor in the solar cell portion in order to raise the efficiency of the power receiving device.

However, if epitaxial growth of a compound semiconductor solar cell on a Si substrate is attempted, lattice mismatch with the Si substrate becomes large. As a result, it is necessary to devise a buffer layer for epitaxial growth, and so forth in order to raise the quality of the crystal to form a high-efficiency power receiving solar cell, and this leads to a rise in epitaxial cost.

In addition, the temperature on epitaxial growth becomes relatively high, and the epitaxial growth is carried out in an impurity atmosphere for Si. Therefore, the difficulty of process design accompanying substrate contamination increases.

As a result, device production cost becomes high in any case.

CITATION LIST

Patent Literature

Patent Document 1: JP 2018-148074 A
Patent Document 2: JP 2013-4632 A
Patent Document 3: JP 2008-210886 A

SUMMARY OF INVENTION

Technical Problem

As a technique for mounting an additional device in an electronic device, there is a technique of bonding a functional layer and a substrate. Examples of techniques regarding the bonding of a functional layer and a substrate include Patent Documents 1 to 3. Patent Document 1 discloses a technique of bonding a functional layer and a substrate with BCB (benzocyclobutene). Patent Document 2 discloses a technique of etching a sacrificial layer. Patent Document 3 discloses a technique of flip-bonding a chip to a drive circuit substrate. However, Patent Documents 1 to 3 do not disclose techniques regarding methods for producing an electronic device provided with a drive circuit, a solar cell structure, and a capacitor-function portion in one chip.

The present invention has been made in view of the above-described problems, and an object thereof is to provide: a method for producing an electronic device including a drive circuit, a solar cell structure, and a capacitor-function portion in one chip and having a suppressed production cost; and such an electronic device.

Solution to Problem

To achieve the object, the present invention provides a method for producing an electronic device having a drive circuit comprising a solar cell structure, the method comprising the steps of:

providing a first wafer having a plurality of independent solar cell structures comprising a compound semiconductor, the solar cell structures being formed on a starting substrate by epitaxial growth, and a second wafer having a plurality of independent drive circuits formed, so that either one of the first wafer or the second wafer has a plurality of independent diode circuits and capacitor-function laminated portions;

obtaining a bonded wafer by bonding the first wafer and the second wafer so that the plurality of solar cell structures, the plurality of diode circuits, the plurality of capacitor-function laminated portions, and the plurality of drive circuits are respectively superimposed;

wiring the bonded wafer so that electric power can be supplied from the plurality of solar cell structures to the plurality of diode circuits, the plurality of capacitor-function laminated portions, and the plurality of drive circuits respectively; and producing an electronic device having the drive circuit comprising the solar cell structure by dicing the bonded wafer.

In this manner, the area of an electronic device can be made extremely small by: providing a first wafer having a plurality of independent solar cell structures and a second wafer having a plurality of independent drive circuits formed so that either the first wafer or the second wafer has a plurality of independent diode circuits and capacitor-function laminated portions; and bonding the first wafer and the second wafer so that the plurality of solar cell structures, the plurality of diode circuits, the plurality of capacitor-function laminated portions, and the plurality of drive circuits are respectively superimposed. Thus, it is possible to suppress the production cost of an electronic device having a drive circuit including a solar cell structure.

Furthermore, the bonding is preferably carried out using a thermosetting adhesive.

By carrying out the bonding using a thermosetting adhesive as described, the bonding can be performed at a low temperature. Therefore, in addition, the physical properties of the solar cell structure and drive circuit portions do not change in the heat treatment required for bonding, so that the bonding step can be performed after forming the solar cell structure, the diode circuit, the capacitor-function laminated portion, and the drive circuit.

Furthermore, the starting substrate is preferably isolated from the bonded wafer after carrying out the bonding.

By isolating the starting substrate from the bonded wafer in this manner, the starting substrate can also be reused, and costs can be reduced.

Furthermore, in the inventive method for producing an electronic device, the wiring can be carried out by:

providing a pad electrode in the second wafer before carrying out the bonding so that electric power can be supplied to the drive circuit;

forming an electrode for a solar cell structure at least either one of before or after carrying out the bonding so that electric power can be extracted from the solar cell structure of the first wafer; and electrically connecting the pad electrode and the electrode for a solar cell structure after the bonding.

In the inventive method for producing an electronic device, the wiring can be carried out in this manner, to be specific.

Furthermore, the present invention provides an electronic device having a solar cell structure on a substrate provided with a drive circuit, wherein a diode circuit and a capacitor-function laminated portion are disposed between the solar cell structure and the drive circuit;

an electrical connection is formed by wiring so that electric power can be supplied from the solar cell structure to the diode circuit, the capacitor-function laminated portion, and the drive circuit; and the solar cell structure is electrically separated from the diode circuit, the capacitor-function laminated portion, or the drive circuit with a thermosetting adhesive except for the wiring.

With such an electronic device, the area of the device can be made extremely small, and production cost can be suppressed.

Advantageous Effects of Invention

With the inventive method for producing an electronic device and electronic device, it is possible to make the area of an electronic device provided with a solar cell structure, including a diode circuit and a capacitor function, and having a drive circuit extremely small. Thus, the production cost of electronic devices can be suppressed.

BRIEF DESCRIPTION OF DRAWINGS

FIG. 1 is a schematic view showing an electronic device process of the present invention in progress, and is a schematic view showing a first wafer having a solar cell structure and a diode portion formed.

FIG. 2 is a schematic view showing an electronic device process of the present invention in progress, and is a schematic view showing the first wafer further having a contact portion formed.

FIG. 3 is a schematic view showing an electronic device process of the present invention in progress, and is a schematic view showing the first wafer further having a capacitor-function laminated portion formed.

FIG. 4 is a schematic view showing an electronic device process of the present invention in progress, and is a schematic view showing the first wafer further having a contact electrode formed.

FIG. 5 is a schematic view showing an electronic device process of the present invention in progress, and is a schematic view showing the first wafer further having an adhesive layer formed.

FIG. 6 is a schematic view showing an electronic device process of the present invention in progress, and is a schematic view showing the first wafer etched for device isolation.

FIG. 7 is a schematic view showing an electronic device process of the present invention in progress, and is a schematic view showing the first wafer further etched for device isolation.

FIG. 8 is a schematic view showing an electronic device process of the present invention in progress, and is a schematic view showing the bonding of the first wafer and the second wafer.

FIG. 9 is a schematic view showing an electronic device process of the present invention in progress, and is a schematic view showing the isolation of a starting substrate from the bonded wafer.

FIG. 10 is a schematic view showing an electronic device process of the present invention in progress, and is a schematic view showing the partial processing of the bonded wafer.

FIG. 11 is a schematic view showing an electronic device process of the present invention in progress, and is a schematic view showing the SiO$_2$ coating of the bonded wafer.

FIG. 12 is a schematic view showing an electronic device process of the present invention in progress, and is a schematic view showing the formation of electrodes on the bonded wafer.

FIG. 13 is a schematic view showing an electronic device process of the present invention in progress, and is a schematic view showing a metal wiring in the bonded wafer.

DESCRIPTION OF EMBODIMENTS

As stated above, electronic devices such as sensors for IoT require chips that are compact and that are driven with low power consumption, and are required to be inexpensive. It is ideal to provide a power source on the outside to drive various sensors by electric power supplied from outside to achieve stable operation. However, mounting cost required for wiring becomes massive, and inexpensive sensor-mounting becomes difficult. Accordingly, sensors for IoT require the realization of devices that do not need to be wired for a drive power source.

The present inventor has earnestly studied and found out that an electronic device having a drive circuit including a solar cell structure produced in the following manner makes is possible to make the area of the electronic device extremely small so that production cost can be suppressed. A first wafer having a plurality of independent solar cell structures including a compound semiconductor, the solar cell structures being formed on a starting substrate by epitaxial growth, and a second wafer having a plurality of independent drive circuits formed are provided so that either one of the first wafer or the second wafer has a plurality of independent diode circuits and capacitor-function laminated portions. These wafers are bonded so that the plurality of solar cell structures, the plurality of diode circuits, the plurality of capacitor-function laminated portions, and the plurality of drive circuits are respectively superimposed. Wiring is carried out so that electric power can be supplied from the plurality of solar cell structures to the plurality of diode circuits, the plurality of capacitor-function laminated portions, and the plurality of drive circuits respectively. Then, dicing is performed. Thus, the present invention has been completed.

The present invention is a method for producing an electronic device having a drive circuit including a solar cell structure, and includes the following steps. That is, the steps of (a) providing a first wafer having a plurality of independent solar cell structures comprising a compound semiconductor, the solar cell structures being formed on a starting substrate by epitaxial growth, and a second wafer having a plurality of independent drive circuits formed, so that either one of the first wafer or the second wafer has a plurality of independent diode circuits and capacitor-function laminated portions, (b) obtaining a bonded wafer by bonding the first wafer and the second wafer so that the plurality of solar cell structures, the plurality of diode circuits, the plurality of capacitor-function laminated portions, and the plurality of drive circuits are respectively superimposed, (c) wiring the bonded wafer so that electric power can be supplied from the plurality of solar cell structures to the plurality of diode circuits, the plurality of capacitor-function laminated portions, and the plurality of drive circuits respectively, and (d) producing an electronic device having the drive circuit comprising the solar cell structure by dicing the bonded wafer.

Hereinafter, embodiments of the present invention will be described on the basis of the drawings.

Embodiment

Firstly, a first wafer having a plurality of independent solar cell structures including a compound semiconductor, the solar cell structures being formed on a starting substrate by epitaxial growth is provided. As described above, the plurality of independent diode circuits and capacitor-function laminated portions can be provided in either one of the first wafer or the second wafer. However, here, the description will be given with these provided on the first wafer.

FIG. 1 shows a schematic view of the first wafer 100. In the first wafer 100, a plurality of solar cell structures are formed on a starting substrate 10 by epitaxial growth.

More specifically, the solar cell structures can be formed in the following manner, but the solar cell structures can adopt various structures including a compound semiconductor. Firstly, a p-GaAs buffer layer (not shown) with a thickness of 0.5 μm for example, a p-AlAs sacrificial layer 11 with a thickness of 0.3 μm for example, a p-GaAs contact layer 12 with a thickness of 0.3 μm as a first p-GaAs layer for example, a p-$In_{0.5}Ga_{0.5}P$ window layer 13 with a thickness of 0.2 μm for example, a p-GaAs emitter layer 14 with a thickness of 0.5 μm as a second p-GaAs layer for example, an n-GaAs base layer 15 with a thickness of 3.5 μm as a first n-GaAs layer for example, and a BSF (Back Surface Field) layer 16 with a thickness of 0.05 μm including n-$In_{0.5}Ga_{0.5}P$ for example are formed on the starting substrate 10 including GaAs to prepare the first wafer 100 having the solar cell structures. At the stage of FIG. 1, device isolation has not been carried out, and the solar cell structures are not independent. The configuration, composition, thickness, etc.

of each layer of the solar cell structures can be designed appropriately. For example, here, $In_{0.5}Ga_{0.5}P$ can be laminated under conditions of pseudo-lattice matching, and is not limited to the exemplified composition as long as the film thickness is the critical film thickness or less.

On the BSF layer 16 in FIG. 1, an n-GaAs contact layer 31 with a thickness of 0.3 μm as a second n-GaAs layer for example, an $n^+$-GaAs tunnel junction layer 32 with a thickness of 0.01 μm as a third n-GaAs layer for example, a p-GaAs layer (p-type layer for a diode) 33 with a thickness of 0.3 μm as a third p-GaAs layer for example, and an n-GaAs layer (n-type layer for a diode) 34 with a thickness of 0.3 μm as a fourth n-GaAs layer for example are further formed. In this manner, it is possible to obtain a first wafer 100 having a diode portion (diode circuit) 30 including these layers formed on the solar cell structure. Thus, a PV-EPW (photovoltaic-epitaxial wafer) with a diode can be provided. This diode portion (diode circuit) 30 prevents a reverse flow of an electric current after producing the electronic device.

Next, as shown in FIG. 2, a contact portion 40 can be formed on the first wafer 100 having the diode portion (diode circuit) 30 formed on the solar cell structure shown in FIG. 1. As the contact portion 40, an AuSi layer 41 of 0.1 μm for example, a first Ti layer 42 with a thickness of 0.1 μm for example, and an Al layer 43 with a thickness of 0.5 μm for example can be formed to obtain a contact portion including these layers.

Furthermore, a capacitor-function laminated portion 50 can be formed, as shown in FIG. 3, on the first wafer 100 of FIG. 2 having such a contact portion formed. As the capacitor-function laminated portion 50, a first Pt layer 51 with a thickness of 0.5 μm for example, a Ta layer 52 with a thickness of 0.5 μm for example, a $TiBaO_3$ layer 53 with a thickness of 0.1 μm for example, a second Ti layer 54 with a thickness of 0.5 μm for example, and a second Pt layer 55 with a thickness of 0.5 μm for example can be formed to obtain a capacitor layer including these layers.

Next, as shown in FIG. 4, a first $SiO_2$ film 61 can be formed on the first wafer 100 of FIG. 3 having the capacitor-function laminated portion 50 formed. The first $SiO_2$ film 61 can be formed by a P-CVD method (plasma-chemical vapor deposition method) with a thickness of 0.1 μm for example. Furthermore, as shown in FIG. 4, a part of the first $SiO_2$ film 61 can be opened to form a first contact electrode 62 including Au. Note that the first $SiO_2$ film 61 is an adhesion reinforcement layer for the BCB film, and the first $SiO_2$ film 61 does not necessarily need to be provided.

Next, as shown in FIG. 5, a BCB (benzocyclobutene) film 63 is formed as a thermosetting adhesive on the first $SiO_2$ film 61 by a spin-coating method with a thickness of 0.2 μm, for example. As a thermosetting adhesive that can be used in the present invention, a BCB (benzocyclobutene) resin is preferably used, but the thermosetting adhesive is not limited thereto. After applying the BCB film 63, it is preferable to eliminate a solvent by a heat treatment at around 100° C. The BCB film 63 preferably has a thickness of 0.05 μm or more, more preferably 0.1 μm or more. A BCB film 63 with such a thickness enables the realization of more favorable wafer bonding. The thickness of the BCB film 63 is preferably 2.0 μm or less, more preferably 1.0 μm or less. Such a thickness of the BCB film 63 can suppress a rise in cost. In addition, with such a thickness, the amount of deformation due to bonding pressure can be made small and the amount adhered to a side of an isolated pattern is not increased, so that the subsequent steps of etching a sacrificial layer and forming a pattern can be performed easily.

Next, a resist pattern that is open in portions intended for device isolation (device-isolation intended portions) for making the contact electrode 62 parts and solar cell structures independent is formed on the BCB film 63 by a photoresist process. The BCB film 63, the SiO$_2$ film 61, the capacitor portion 50, and a part of the contact portion 40 (the Al layer 43 and the first Ti layer 42) are patterned by performing an ICP (inductively coupled plasma) treatment under a mixed plasma atmosphere of a fluorine-containing gas (NF$_3$, SF$_6$, or the like) and Ar gas (see FIG. 5). Here, the ICP treatment can be performed under the conditions of an atmosphere pressure of 1.0 Pa and a total flow rate of the NF$_3$ and Ar gasses of 50 sccm. However, the conditions are not limited thereto as long as the patterning of the BCB film 63, the SiO$_2$ film 61, the capacitor portion 50, and a part of the contact portion 40 is possible under the conditions.

Next, regarding the AuSi layer 41 of the contact portion 40, the AuSi layer 41 can be removed and opened by performing a wet treatment with a KI-containing solution (see FIG. 6).

After opening the AuSi layer 41, a substrate for bonding (first wafer 100) subjected to device isolation of the diode portion 30 and the solar cell structure (PV portion) is formed by performing an ICP treatment under a mixed plasma atmosphere of Ar gas as shown in FIG. 7. Here, the ICP treatment can be performed under the conditions of an atmosphere pressure of 1.0 Pa and a total flow rate of the Cl$_2$ and Ar gasses 50 sccm. However, the conditions are not limited thereto as long as the device isolation patterning of the diode portion 30 and the solar cell structure (PV portion) is possible under the conditions.

After carrying out the device isolation patterning in this manner, the resist pattern is removed. The resist removal can be performed by an ashing treatment, but the removal is not limited thereto, and the resist may also be removed by organic cleaning and other degreasing treatments. In addition, the device isolation was performed by an ICP treatment, but the device isolation is not limited to the technique of the ICP treatment, and a known method can be employed. For example, the device isolation may be carried out by etching the GaAs layer with a mixed solution of tartaric acid and hydrogen peroxide and etching the InGaP with a mixed liquid of hydrochloric acid and phosphoric acid. By the above process, a first wafer 100 having a plurality of independent solar cell structures including a compound semiconductor and having a plurality of independent diode portions (diode circuits) 30 and capacitor-function laminated portions 50 can be prepared as shown in FIG. 7.

Figure 8:
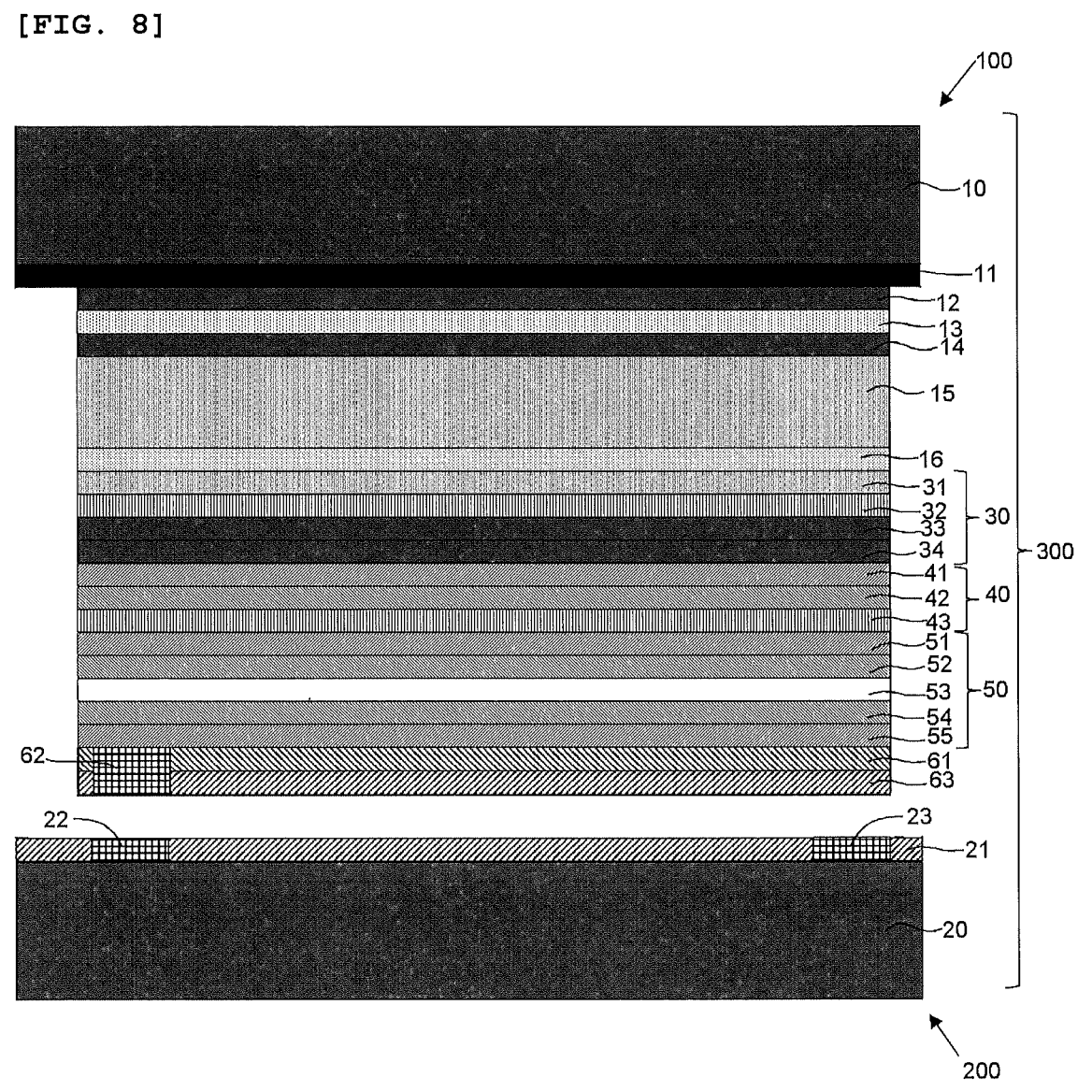

Next, as a second wafer 200, a drive circuit substrate 20 having a drive circuit and power receiving pad portions (first pad electrode 22 and second pad electrode 23) for input on a Si substrate is prepared (see FIG. 8). Next, as shown in FIG. 8, a second SiO$_2$ film 21 with a thickness of 0.1 μm for example is formed on a surface of the drive circuit substrate 20. Note that the second SiO$_2$ film 21 is an adhesion reinforcement layer for the BCB film, and therefore, the second SiO$_2$ film 21 does not necessarily need to be provided.

Next, the drive circuit substrate 20 and the substrate for bonding are aligned so that the positions of the first pad electrode 22 and the first contact electrode 62 come to nearly the same position. The drive circuit substrate 20 and the substrate for bonding are superimposed to face each other, and are bonded, for example, at a temperature of 300° C. while applying a pressure of about 250 N/cm$^2$ (bonded wafer 300).

Here, a heat treatment condition of 300° C. has been given as an example, but this is only because the temperature condition required for BCB to cure in a short time is 300° C. Even if low temperature conditions are selected, curing is possible by making the holding time longer, and the temperature conditions are not limited thereto. Meanwhile, a pressure of about 250 N/cm$^2$ has been given as an example, but this is only a pressure at which bonding can be carried out with certainty. Bonding is possible under a pressure lower than this pressure by taking a longer bonding time, and the value of the pressure is not limited thereto.

After the bonding, the sacrificial layer 11 is etched as shown in FIG. 9. The sacrificial layer 11 is etched with a fluorine-containing solution. Since the device-isolation intended portion is open as shown in FIG. 8 and FIG. 9, the fluorine-containing liquid reaches the AlAs sacrificial layer 11 quickly and etches the sacrificial layer 11.

Since the fluorine-containing liquid has etching selectivity to the layers other than the sacrificial layer 11, only the AlAs sacrificial layer 11 is selectively removed. By the elimination of the sacrificial layer 11, the solar cell structure, the diode portion (diode circuit) 30 and the capacitor-function laminated portion 50 remain on the drive circuit substrate side (second wafer 200 side), and the starting substrate 10 part is isolated from the bonded wafer 300.

The isolated starting substrate 10 can be reused as a substrate for epitaxial growth. The starting substrate 10 can be repolished on the surface as necessary and then used.

Next, a partially open pattern is formed in the bonded wafer 300 by a photolithography method to etch the wafer from the p-GaAs contact layer (first p-GaAs layer) 12 to the AuSi layer 41 by the same ICP treatment as described above. Next, a part of the AuSi layer 41 not coated with a resist is removed with a KI solution (see FIG. 10). The resist is removed after forming the pattern of the AuSi layer 41.

Next, a partially open pattern is formed by a photolithography method, and a part of the capacitor-function laminated portion 50 not coated with a resist is removed by an ICP treatment to form a pattern, leaving the second Ti layer 54 portion (see FIG. 10). The resist is removed after forming the pattern of the capacitor-function laminated portion 50.

Next, a partially open pattern is formed by a photolithography method, and a part of the second Ti layer 54 to the BCB film 63 not coated with a resist is removed by an ICP treatment to form a pattern with a part of the second SiO$_2$ layer 21 exposed (see FIG. 10). The resist is removed after forming the exposed pattern of the second SiO$_2$ layer 21 part on the second wafer 200 (substrate for driving) side. Note that although an example in which a pattern is formed with the second SiO$_2$ layer 21 part exposed has been given, the second SiO$_2$ layer 21 part does not necessarily need to remain, and may be removed in the pattern.

Next, the entire wafer is coated with a third SiO$_2$ film 72 with a thickness of 0.1 μm, for example (see FIG. 11). Next, as shown in FIG. 11, a pattern that is open in a part of the third SiO$_2$ film 72 is formed, and a pattern that is open in a part of the contact layer (first p-GaAs layer) 12, a part of the first Ti layer 42, a part of the first Pt layer 51, a part of the second Ti layer 54, and the second pad electrode 23 is formed by a photolithography method, and a part of the third SiO$_2$ film 72 is opened by etching with a fluorine-containing solution. After opening a part of the third SiO$_2$ film 72, the resist is removed.

Next, a second contact electrode 73, contacting the contact layer (first p-GaAs layer) 12 is formed in the SiO$_2$ opening as shown in FIG. 12.

Here, the second contact electrode 73, which is in contact with the contact layer (first p-GaAs layer) 12 is formed with Au containing Be, and the electrode is formed with a thickness of 0.5 μm, for example. Note that materials are not limited to those described above as long as an ohmic contact can be formed, and any materials can be selected.

Next, as shown in FIG. 13, the second pad electrode 23, the opening of the first Pt layer 51, and the second contact electrode 73 are joined to form a metal wiring 77. An opening pattern is formed by a photolithography method, an Al layer is deposited with a thickness of 0.5 μm, for example, and a wiring pattern is formed by a liftoff method. Furthermore, the opening of the second Ti layer 54 and the opening of the first Ti layer 42 are joined to form a metal wiring 78. An opening pattern is formed by a photolithography method, 0.5 μm of an Al layer is deposited, and a wiring pattern is formed by a liftoff method.

The bonded wafer 300 is fabricated in this manner. A plurality of electronic device structures are formed in the bonded wafer 300. The electronic device structures are individually isolated by dicing such a bonded wafer 300. Thus, an electronic device having a drive circuit including a solar cell structure can be produced.

An electronic device produced by dicing the bonded wafer 300 shown in FIG. 13 can have the following configuration. This electronic device is an electronic device having a solar cell structure on a substrate provided with a drive circuit (drive circuit substrate 20), and a diode portion (diode circuit) 30 and a capacitor-function laminated portion 50 are disposed between the solar cell structure and the drive circuit. Furthermore, an electrical connection is formed with wirings 77 and 78 so that electric power can be supplied from the solar cell structure to the diode circuit 30, the capacitor-function laminated portion 50, and the drive circuit. Furthermore, the solar cell structure and the diode circuit 30, the capacitor-function laminated portion 50, or the drive circuit are electrically separated with a thermosetting adhesive (BCB film 63) except for the wirings 77 and 78. In the case of the above-described example, the solar cell structure is adhered to the drive circuit (drive circuit substrate 20) with the thermosetting adhesive (BCB film 63) between the capacitor-function laminated portion 50 and the drive circuit.

A solar cell (PV) can have a greater receiving electric power with increased area, and therefore, a larger area is advantageous in view of driving electric power. In addition, regarding the capacity of the capacitor, the larger the area, the greater the amount of electric charge that can be stored, and therefore, a larger area is advantageous. In conventional examples, the solar cell structure portion, the capacitor-function portion, and the drive circuit portion are provided on the same surface, and in order to receive greater electric power, the area of the device becomes larger. However, in the present invention, the area of the device can be minimized since the power receiving portion and the capacitor-function portion are provided on the drive circuit portion.

In addition, in particular, the temperature at bonding can be 300° C., which is low, by using a thermosetting adhesive when bonding. Accordingly, the physical properties of the drive circuit portion do not change in the heat treatment required for bonding, so that the bonding step can be performed after forming the drive circuit. The temperature at bonding is 300° C., which is low, so that the physical properties of the solar cell structure portion and the capacitor-function portion do not change in the heat treatment required for bonding. Therefore, the bonding step can be performed after forming the electrode in the solar cell structure portion. Thus, it is possible to realize a functional substrate having functions of a solar cell structure portion, a capacitor-function portion, and a drive circuit without losing the properties of each material.

Furthermore, the present invention contributes to a rise in yield, since the drive circuit substrate and the solar cell structure portion (and the capacitor-function portion) can be formed separately, so that the most suitable conditions can be selected when forming each functional portion.

In addition, in the present invention, the positions of the output electrode in the solar cell structure portion and the input electrode in the drive circuit portion are made to match, and then bonding is carried out. Thus, wiring formation precision and the yield accompanying wiring formation can be raised.

In addition, according to the present invention, it is possible to prevent, by carrying out the formation of the solar cell structure portion and the formation of the drive circuit in separate processes, degradation in yield accompanying faults occurring after lamination.

In addition, if an epitaxial layer of a solar cell structure is formed in a drive circuit portion, material cost that accompanies the formation of a buffer layer accounts for a large proportion of costs. However, by separating the process for the solar cell structure-formed substrate and the process for the drive circuit-formed substrate, each can be formed with the optimum design at the minimum cost, and the total cost can be lowered.

In addition, the cost of the epitaxial layer of the solar cell structure is high, and the cost of the starting substrate accounts for a large proportion. Since bonding is carried out after carrying out the device isolation of the solar cell structure portion, an epitaxial liftoff process can be applied, and epitaxial cost can be reduced by reusing the delaminated starting substrate.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. An electronic device having a solar cell structure comprising a compound semiconductor on a drive circuit substrate in which a Si substrate is provided with a drive circuit, wherein a diode circuit that is non-light-emitting and a capacitor-function laminated portion are disposed between the solar cell structure and the drive circuit substrate;

the capacitor-function laminated portion, the diode circuit, and the solar cell structure are laminated over the drive circuit substrate vertically;

an electrical connection is formed by wiring so that electric power can be supplied from the solar cell structure to the diode circuit, the capacitor-function laminated portion, and the drive circuit;

the solar cell structure is electrically separated from the diode circuit, the capacitor-function laminated portion, or the drive circuit with a thermosetting adhesive except for the wiring; and at least a portion of at least one of the drive circuit, the capacitor-function laminated portion, the diode circuit, and the solar cell structure is covered with a $SiO_2$ film.

* * * * *